(12) United States Patent
Chen

(10) Patent No.: US 8,451,605 B2
(45) Date of Patent: May 28, 2013

(54) ENCLOSURE OF ELECTRONIC APPARATUS

(75) Inventor: Yun-Lung Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 272 days.

(21) Appl. No.: 12/938,596

(22) Filed: Nov. 3, 2010

(65) Prior Publication Data
US 2011/0317362 A1 Dec. 29, 2011

(30) Foreign Application Priority Data

Jun. 23, 2010 (CN) .......................... 2010 1 0207293

(51) Int. Cl.
*H05K 7/20* (2006.01)

(52) U.S. Cl.
USPC ...................................... 361/695; 361/679.48

(58) Field of Classification Search
USPC ............................................ 361/679.48, 695
See application file for complete search history.

(56) References Cited

U.S. PATENT DOCUMENTS

| | | | | |
|---|---|---|---|---|
| 5,777,848 A * | 7/1998 | McAnally et al. | ............ | 361/725 |
| 5,835,347 A * | 11/1998 | Chu | .............. | 361/697 |
| 5,854,738 A * | 12/1998 | Bowler | ........ | 361/695 |
| 5,973,921 A * | 10/1999 | Lin | .............. | 361/695 |
| 6,104,609 A * | 8/2000 | Chen | ............. | 361/695 |
| 6,134,115 A * | 10/2000 | Sim et al. | ...................... | 361/747 |
| 6,269,001 B1 * | 7/2001 | Matteson et al. | ............. | 361/695 |
| 6,313,989 B1 * | 11/2001 | Kuang | .................. | 252/62.9 PZ |
| 6,317,320 B1 * | 11/2001 | Cosley et al. | ................. | 361/695 |
| 6,327,148 B1 * | 12/2001 | Tucker et al. | ................. | 361/704 |
| 6,587,342 B1 * | 7/2003 | Hsu | ............... | 361/695 |
| 6,672,374 B1 * | 1/2004 | Lin | ................. | 165/121 |
| 6,894,898 B2 * | 5/2005 | Liu | ............. | 361/697 |
| 6,950,306 B2 * | 9/2005 | Huang et al. | .................. | 361/697 |
| 7,054,155 B1 * | 5/2006 | Mease et al. | .................. | 361/695 |
| 7,133,288 B2 * | 11/2006 | DelPrete et al. | ............. | 361/719 |
| 7,236,361 B2 * | 6/2007 | Cote et al. | ...................... | 361/695 |
| 7,580,259 B2 * | 8/2009 | Hsiao | ........................... | 361/695 |
| 7,633,755 B2 * | 12/2009 | Zhou et al. | ..................... | 361/697 |
| 7,821,788 B2 * | 10/2010 | Hsiao | ........................... | 361/695 |
| 7,916,471 B2 * | 3/2011 | Miyamoto et al. | ......... | 361/679.5 |
| 8,064,199 B2 * | 11/2011 | Lin | ............................. | 361/695 |
| 8,223,493 B2 * | 7/2012 | Ye | ................................. | 361/695 |
| 2003/0188847 A1 * | 10/2003 | Lai et al. | ...................... | 165/80.2 |
| 2004/0121719 A1 * | 6/2004 | Robison et al. | .............. | 454/143 |
| 2006/0256522 A1 * | 11/2006 | Wei et al. | ..................... | 361/695 |
| 2007/0047200 A1 * | 3/2007 | Huang | ........................... | 361/695 |
| 2007/0243816 A1 * | 10/2007 | Russak et al. | ................. | 454/208 |
| 2008/0041561 A1 * | 2/2008 | Zhou et al. | ................... | 165/80.3 |
| 2008/0101021 A1 * | 5/2008 | Sanchez et al. | ............... | 361/695 |
| 2009/0154092 A1 * | 6/2009 | Chen | ........................... | 361/679.51 |
| 2010/0314080 A1 * | 12/2010 | Cao et al. | ...................... | 165/121 |
| 2011/0067836 A1 * | 3/2011 | Tang et al. | ....................... | 165/67 |
| 2011/0086589 A1 * | 4/2011 | Skrepcinski et al. | ......... | 454/184 |
| 2011/0100600 A1 * | 5/2011 | Tang et al. | ....................... | 165/96 |
| 2011/0122573 A1 * | 5/2011 | Peng et al. | ............... | 361/679.48 |
| 2011/0216498 A1 * | 9/2011 | Lee | ............................. | 361/679.33 |
| 2012/0033376 A1 * | 2/2012 | Chen et al. | ............... | 361/679.48 |

* cited by examiner

*Primary Examiner* — Anatoly Vortman
(74) *Attorney, Agent, or Firm* — Altis Law Group, Inc.

(57) ABSTRACT

An enclosure of an electronic apparatus, includes a chassis and a fan bracket assembly. The fan bracket assembly is mounted in the chassis. The fan bracket assembly includes a first fan bracket with a first fan mounted therein and a second fan bracket with a second fan mounted therein. The second fan bracket is pivotably mounted on the first fan bracket, and configured to be positioned at different positions relative to the first fan bracket.

15 Claims, 4 Drawing Sheets

ENCLOSURE OF ELECTRONIC APPARATUS

BACKGROUND

1. Technical Field

The present disclosure relates to enclosures of electronic apparatuses, and more particularly to an enclosure mounted with fans for dissipating heat.

2. Description of Related Art

Various electrical apparatuses nowadays, and especially the desktop computer, are crowded with different electrical components and peripheral devices, such as the central processing unit (CPU), the interface card, the data storage devices, and the power supply. These electrical components and peripheral devices generate heat during operation. The inner temperature of the desktop computer enclosure can become very high. Therefore, one or more heat dissipation devices, such as fans, are installed inside the computer chassis to remove the heat generated by the electrical components and peripheral devices, to ensure that the inside of the computer chassis maintains a moderate operating temperature. The fans are usually mounted in the computer enclosure by screws. However, because components in the enclosure are removed or added frequently, the fans need to be attached or detached correspondingly. It is always time-consuming and boring to attach or detach the fans on or form the enclosure.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
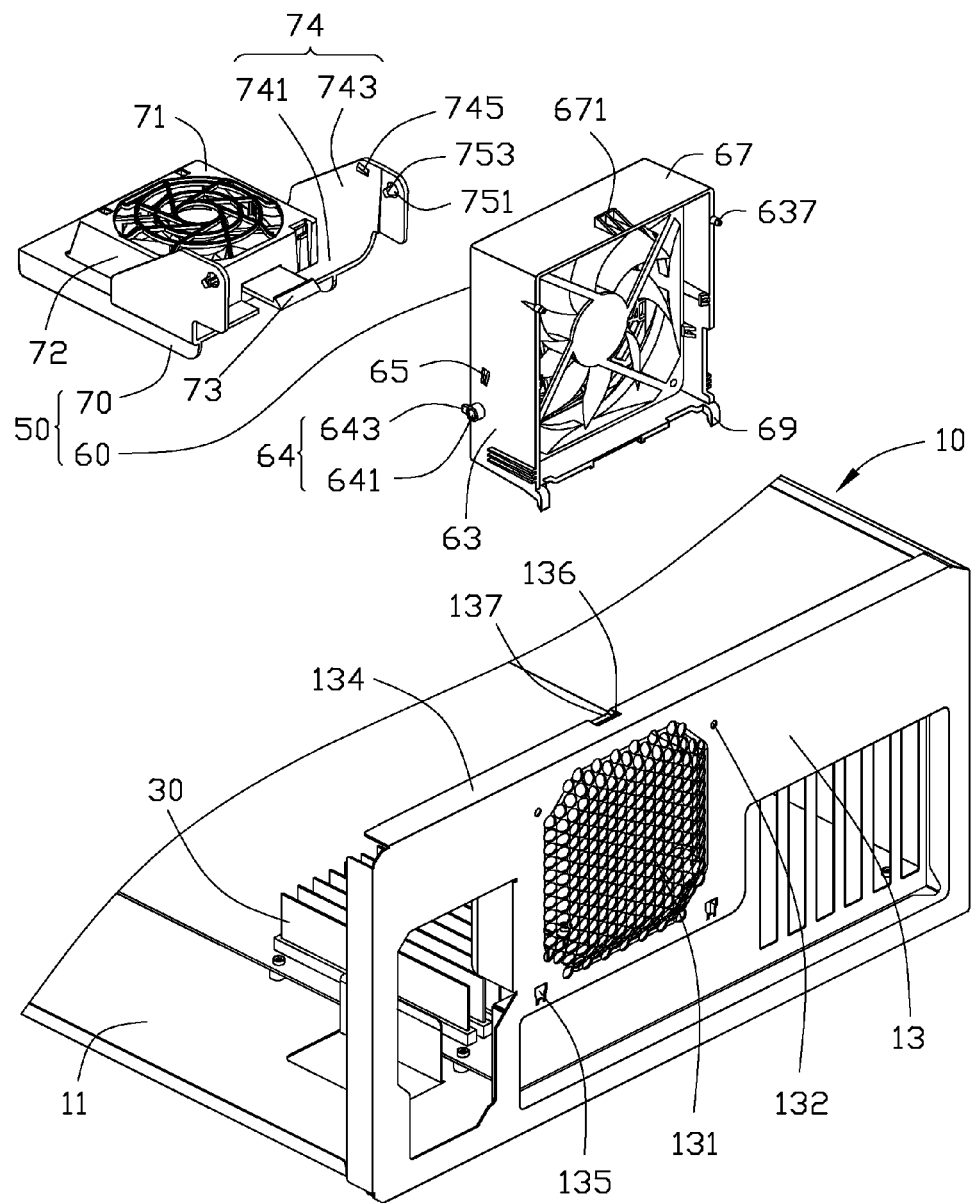
FIG. 1 is an isometric and exploded view of an enclosure of an electronic apparatus in accordance with an embodiment.

Referring to FIG. 1, an enclosure of an electronic apparatus in accordance with an embodiment includes a chassis 10 and a fan bracket assembly 50 adapted to be mounted in the chassis 10.

The chassis 10 includes a bottom wall 11, and a rear wall 13 perpendicular to the bottom wall 11. A number of heat generation apparatuses 30 are mounted on the bottom wall 11. In one embodiment, the heat generation apparatuses 30 are expansion cards. A vent hole portion 131, which defines a plurality of vent holes, are formed on the rear wall 13. The rear wall 13 defines a pair of through holes 132 adjacent to two upper corners of the vent hole portion 131, and defines a pair of engaging holes 135 adjacent to two lower corners of the vent hole portion 131. A top edge of the rear wall 13 can be bent perpendicularly to form a flange 134. An engaging slot 136 is defined in the flange 134. The engaging slot 136 is positioned above the vent hole portion 131. An edge of the engaging slot 136 is sunk from the flange 134 to form a stop piece 137.

Figure 2:
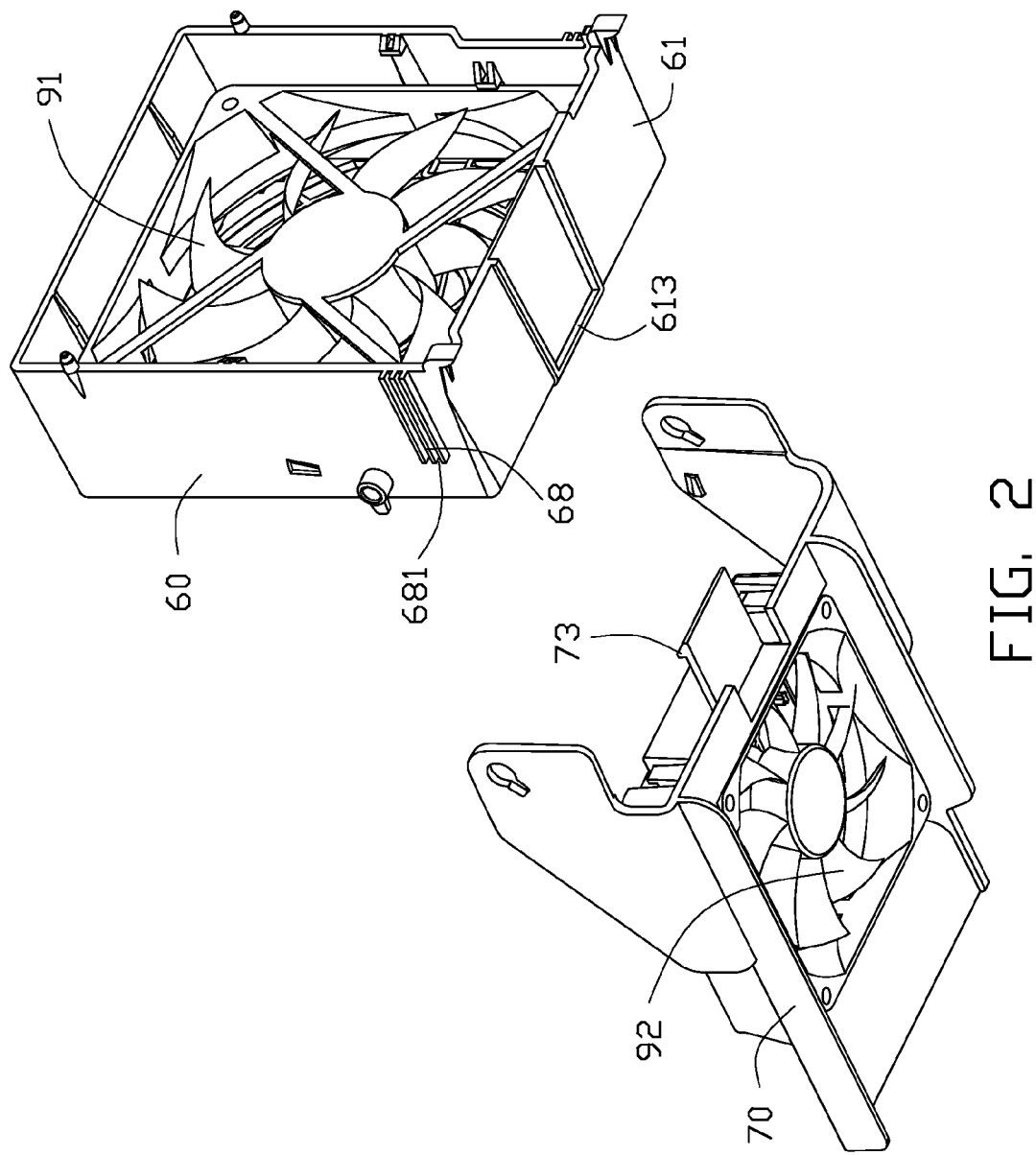
FIG. 2 is an isometric and exploded view of a fan bracket assembly of the enclosure of FIG. 1.
Figure 3:
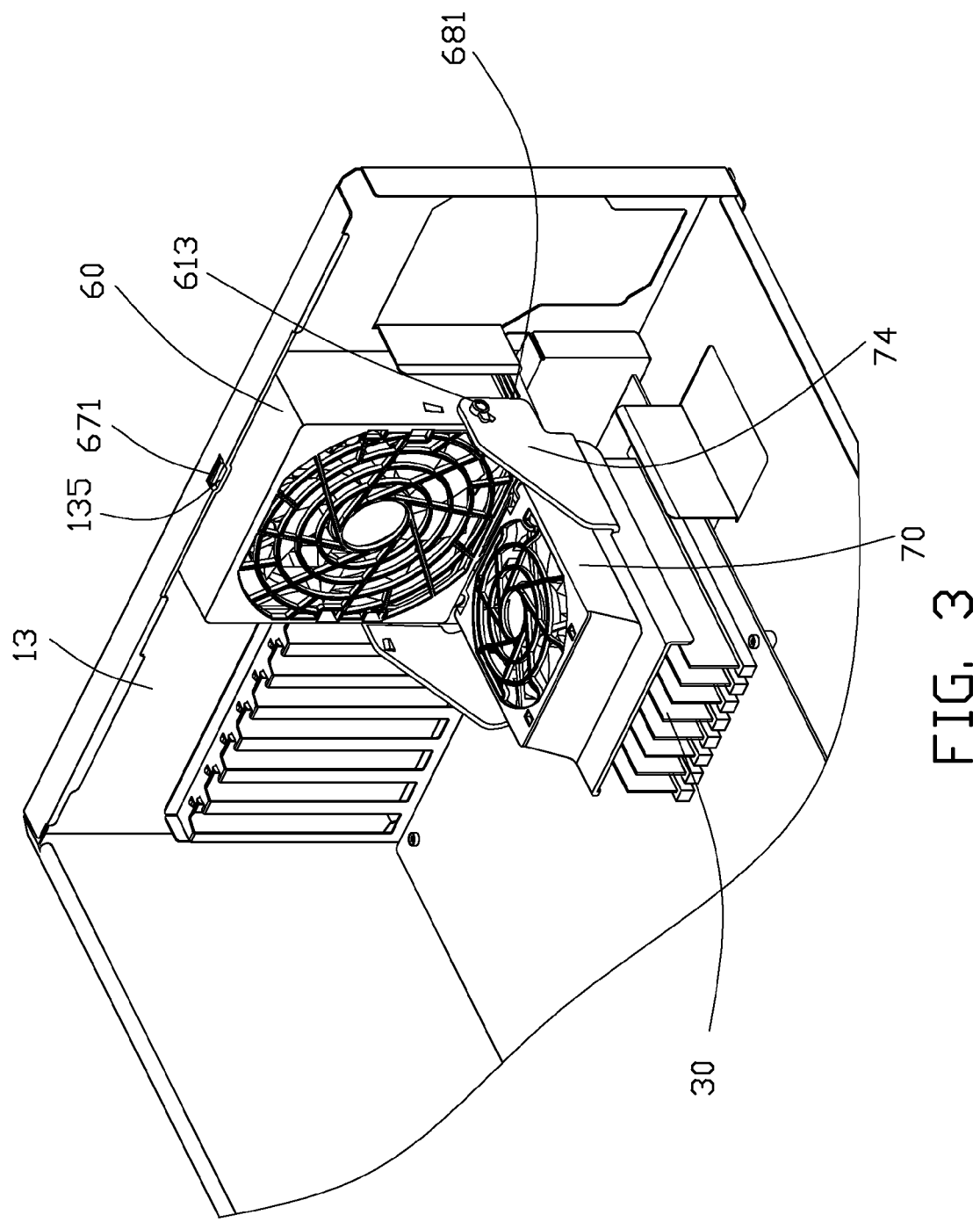
FIG. 3 is an assembly view of the enclosure of FIG. 1.
Figure 4:
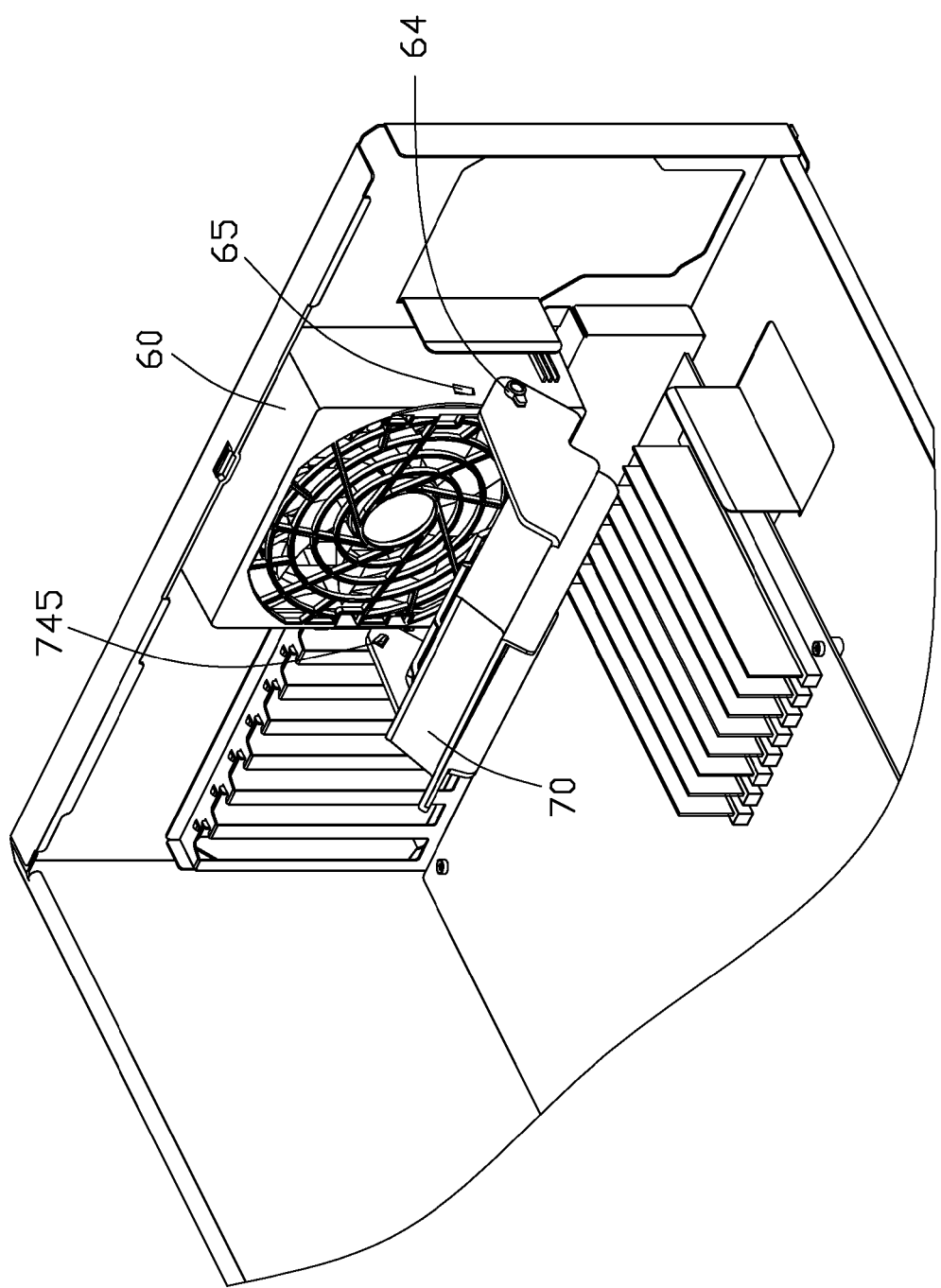
FIG. 4 is another assembly view of the enclosure of FIG. 1.

Referring to FIGS. 1 and 2, the fan bracket assembly 50 includes a first fan bracket 60 and a second fan bracket 70. The first fan bracket 60 has a first fan 91 mounted therein, and the second fan bracket 70 has a second fan 92 mounted therein.

The first fan bracket 60 is a generally rectangular frame, which includes a top plate 67, a bottom plate 61, and a pair of side plates 63. Each side plate 63 forms a pivot shaft 64 thereon. The pivot shaft 64 includes a cylinder-shaped shaft portion 641 and a retaining tab 643 connected to the shaft portion 641. Each side plate 63 defines a cutout 65 adjacent the pivot shaft 64. A rear edge of each side plate 63 forms an insert post 637 and an "L"-shaped foot 69 thereon. The insert post 637 is located above the foot 69. A number of parallel ribs 68 are formed on each side plate 63. Front ends of the ribs 68 are aligned to form a stop face 681. The ribs 68 also enhance a strength of the side plate 63. The top plate 67 forms a wedge-shaped block 671 thereon. The bottom plate 61 forms a pole 613 thereon.

The second fan bracket 70 includes a horizontal guiding piece 71. Four edges of the guiding piece 71 extend downwards to form four side pieces 72. Two opposite side pieces 72 of the four side pieces 72 forms a pair of wing pieces 74 thereon. Each wing piece 74 is formed in an "L"-shape. Each wing piece 74 includes a horizontal root portion 741 and an upright connecting portion 743. The root portion 741 connects to corresponding side piece 72. A free edge of the root portion 741 extends upwards to form the connecting portion 743. The connecting portion 743 defines a pivot hole 751 and a slot 753 communicating with the pivot hole 751. The wing piece 74 forms a positioning block 745 corresponding to the cutout 65 of the first fan bracket 60. A clasp 73 is connected to a front side of the second fan bracket 70.

Referring to FIGS. 1 to 4, to assemble the fan bracket assembly 50, the pivot shaft 64 of the first fan bracket 60 is aligned with corresponding pivot hole 751 and slot 753 of the second fan bracket 70. The shaft portion 641 of the pivot shaft 64 inserts in the corresponding pivot hole 751, and the retaining tab 643 of the pivot shaft 64 inserts in the corresponding slot 753. Then, the first fan bracket 60 rotates around the pivot shaft 64. Then, the retaining tab 643 is not aligned with the slot 753 to pivotally mount the first fan bracket 60 on the second fan bracket 50. The second fan bracket 70 is configured to rotate on the first fan bracket 60 between a first position and a second position.

In the first position, the first fan bracket 60 is generally perpendicular to the second bracket 70. An edge of the wing piece 74 abuts the stop face 681. The clasp 73 of the second fan bracket 70 engages on the pole 613 of the first fan bracket 60 to secure the second fan bracket 70 in the first position. The first fan 91 drives air flowing in a horizontal direction, and the second fan 92 drives air flowing in a vertical direction.

In the second position, the second fan bracket 70 is located generally parallel to the first fan bracket 60. The positioning blocks 745 of the second fan bracket 70 are located in the cutouts 65 of the first fan bracket 60 to secure the second fan bracket 70 in the second position. Both of the first and second fans 91 and 92 drive air flowing in the horizontal direction.

To mount the fan bracket assembly 50 to the chassis 10, the first fan bracket 60 and the second fan bracket 70 are moved in the chassis 10. The feet 69 are inserted in the engaging holes 135. The insert posts 637 are inserted in the through holes 132. Simultaneously, the block 671 of the first fan bracket 60 abuts the stop piece 137 to elastically deform the stop piece 137. The first fan bracket 60 is moved further until the block 671 slides over the stop piece 137 and engages in the engaging slot 136. Therefore, the first fan bracket 60 is mounted on the rear wall 13 of the chassis 10.

In the chassis 10, when the heat generation apparatuses 30 need to dissipate heat, the second fan bracket 70 with the second fan 92 rotates to the first position to dissipate heat of the heat generation apparatuses 30. When the heat generation apparatuses 30 does not need to dissipate heat, the second fan bracket 70 with the second fan 92 rotates to the second position. Then, the first and second fans 91 and 92 are located parallel with each other to drive air flowing via the vent hole portion 131 more quickly. Therefore, the second fan bracket 70 with the second fan 92 can located in different position to suit different situations of the chassis 10.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An enclosure of an electronic apparatus, comprising:
   a chassis,
   a fan bracket assembly mounted in the chassis, the fan bracket assembly comprising a first fan bracket with a first fan mounted therein and a second fan bracket with a second fan mounted therein, the second fan bracket pivotably mounted on the first fan bracket, and configured to be positioned at different positions relative to the first fan bracket;
   wherein the first fan bracket comprises a top plate, the top plate has a block thereon, the chassis comprises a rear wall, a top edge of the rear wall has a flange, an engaging slot is defined in the flange, an edge of the engaging slot has a stop piece, and the block is received in the engaging slot and abuts the stop piece.

2. The enclosure of claim 1, wherein the first fan bracket comprises a pair of side plates, each side plate has a pivot shaft thereon, each pivot shaft comprises a shaft portion and a retaining tab connected to the shaft portion; the second fan bracket comprises a pair of wing pieces, and each wing piece defines a pivot hole and a slot in communication with the pivot hole; the pivot hole receives the shaft portion therein, and the slot receives the retaining tab therein, and the shaft portion is configured to rotate in the pivot hole to misalign the slot with the retaining tab to maintain the shaft portion in the pivot hole.

3. The enclosure of claim 2, wherein a stop face is positioned on at least one of the pair of side plates, a cutout is defined in at least one of the pair of side plates, a positioning block is positioned on at least one of the pair of wing pieces; the second fan bracket is configured to be positioned in a first position and a second position; in the first position, one of the pair of wing pieces abuts the stop face; in the second position, the positioning block is located in the cutout.

4. The enclosure of claim 3, wherein the first fan bracket comprises a pole, the second fan bracket comprises a clasp, and the clasp engages on the pole at the first position.

5. The enclosure of claim 3, wherein the first fan bracket is generally perpendicular to the second fan bracket in the first position, and the first fan bracket is generally parallel to the second fan bracket in the second position.

6. The enclosure of claim 1, wherein the first fan bracket comprises a pair of side plates, the pair of side plates form a pair of feet and a pair of insert posts, the rear wall defines a pair of engaging holes and a pair of through holes, the pair of insert posts of the first fan bracket are received in the pair of through holes, and the pair of feet of the first fan bracket are received in the pair of engaging holes to mount the first fan bracket on the rear wall.

7. The enclosure of claim 6, wherein the rear wall defines a vent hole portion between the pair of through holes and the pair of engaging holes, and the vent hole portion defines a plurality of vent holes.

8. The enclosure of claim 6, wherein the pair of feet are formed in "L" shape.

9. An enclosure of an electronic apparatus, comprising:
   a chassis;
   a fan bracket assembly mounted in the chassis, the fan bracket assembly comprising a first fan bracket with a first fan mounted therein and a second fan bracket with a second fan mounted therein, the second fan bracket pivotably mounted on the first fan bracket between a first position and a second position, wherein a flowing direction of air driven by the first fan is perpendicular to a flowing direction of air driven by the second fan in the first position, and the flowing direction of air driven by the first fan is same to the flowing direction of air driven by the second fan in the second position;
   wherein the first fan bracket comprises a pair of side plates, each side plate has a pivot shaft thereon, each pivot shaft comprises a shaft portion and a retaining tab connected to the shaft portion; the second fan bracket comprises a pair of wing pieces, and each wing piece defines a pivot hole and a slot in communication with the pivot hole; the pivot hole receives the shaft portion therein, and the slot receives the retaining tab therein, and the shaft portion is configured to rotate in the pivot hole to misalign the slot with the retaining tab to maintain the shaft portion in the pivot hole.

10. The enclosure of claim 9, wherein a stop face is positioned on at least one of the pair of side plates, a cutout is defined in at least one of the pair of side plates, a positioning block is positioned on at least one of the pair of wing pieces; in the first position, one of the pair of wing pieces abuts the stop face; in the second position, the positioning block is located in the cutout.

11. The enclosure of claim 10, wherein the first fan bracket comprises a pole, the second fan bracket comprises a clasp, and the clasp engages on the pole at the first position.

12. The enclosure of claim 9, wherein the pair of side plates form a pair of feet and a pair of insert posts, the chassis comprises a rear wall, the rear wall defines a pair of engaging holes and a pair of through holes, the pair of insert posts of the first fan bracket are received in the pair of through holes, and the pair of feet of the first fan bracket are received in the pair of engaging holes to mount the first fan bracket on the rear wall.

13. The enclosure of claim 12, wherein the rear wall defines a vent hole portion between the pair of through holes and the pair of engaging holes, and the vent hole portion defines a plurality of vent holes.

14. The enclosure of claim 13, wherein the pair of feet are formed in "L" shape.

15. The enclosure of claim 9, wherein the first fan bracket comprise a top plate, the top plate has a block thereon, the chassis comprises a rear wall, a top edge of the rear wall has a flange thereon, an engaging slot is defined in the flange, an edge of the engaging slot has a stop piece, and the block is received in the engaging slot and abuts the stop piece.

\* \* \* \* \*